(12) United States Patent
Lu (10) Patent No.: US 7,924,002 B2
(45) Date of Patent: Apr. 12, 2011

(54) MAGNETIC RESONANCE FIELD MAP ESTIMATION FOR SPECIES SEPARATION

(75) Inventor: Wenmiao Lu, Palo Alto, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 560 days.

(21) Appl. No.: 11/971,722

(22) Filed: Jan. 9, 2008

(65) Prior Publication Data

US 2009/0174403 A1    Jul. 9, 2009

(51) Int. Cl.
*G01V 3/00* (2006.01)
(52) U.S. Cl. ........................................ 324/307; 324/309
(58) Field of Classification Search .......... 324/300–322; 600/407–435; 382/128–131
See application file for complete search history.

(56) References Cited

U.S. PATENT DOCUMENTS

| | | | |
|---|---|---|---|
| 4,993,075 A * | 2/1991 | Sekihara et al. ............... | 382/131 |
| 5,485,085 A | 1/1996 | Sumanaweera et al. | |
| 5,751,145 A | 5/1998 | Shimizu | |
| 5,909,119 A | 6/1999 | Zhang et al. | |
| 6,269,176 B1 * | 7/2001 | Barski et al. ................ | 382/128 |
| 6,307,368 B1 | 10/2001 | Vasanawala et al. | |
| 6,459,922 B1 | 10/2002 | Zhang | |
| 6,703,835 B2 | 3/2004 | Patch et al. | |
| 6,771,067 B2 * | 8/2004 | Kellman et al. ................ | 324/307 |
| 6,856,134 B1 | 2/2005 | Reeder et al. | |
| 7,081,751 B2 * | 7/2006 | Twieg ............................ | 324/310 |
| 7,777,486 B2 * | 8/2010 | Hargreaves et al. .......... | 324/309 |
| 2002/0167315 A1 * | 11/2002 | Kellman et al. ................ | 324/309 |
| 2004/0227512 A1 * | 11/2004 | Twieg ............................ | 324/309 |
| 2008/0292167 A1 * | 11/2008 | Todd et al. ..................... | 382/131 |
| 2009/0072826 A1 * | 3/2009 | Hargreaves et al. .......... | 324/309 |
| 2009/0174403 A1 * | 7/2009 | Lu .................................. | 324/307 |
| 2010/0283463 A1 * | 11/2010 | Lu et al. ........................ | 324/309 |

OTHER PUBLICATIONS

Yu et al., "Field map estimation with a region growing scheme for iterative 3-point water-fat decomposition", Magnetic Resonance in Medicine, vol. 54, 2005, pp. 1032-1039.
GH Glover, "Multipoint Dixon technique for water and fat proton and susceptibility imaging", J Magn Reson Imaging, vol. 1, 1991, pp. 521-530.
Reeder et al., "Homodyne reconstruction and IDEAL water-fat decomposition", Magnetic Resonance in Medicine, vol. 54, 2005, pp. 586-593.
Press et al., "Numerical Recipes in C", Cambridge University Press, New York, Ny, $2^{nd}$ ed., pp. 397-401, 1994.
D. Knuth, "The Art of Computer Programming, vol. 3: Sorting and Searching", Addison-Wesley, $3^{rd}$ ed., 1997, pp. 409-413.
Lu et al., "Multiresolution Field Map Estimation Using Golden Section Search for Water-Fat Separation," Magnetic Resonance in Medicine, vol. 60, Issue 1, Jul. 2008, pp. 236-244.
Lu et al., "Multi-Resolution Non-Iterative Field Map Estimation for Water and Fat Separation", Proceedings of the $15^{th}$ Annual Meeting of ISMRM, 2007, p. 1638.

* cited by examiner

*Primary Examiner* — Melissa J Koval
*Assistant Examiner* — Tiffany A Fetzner
(74) *Attorney, Agent, or Firm* — Beyer Law Group LLP (57) ABSTRACT

A method for mapping field inhomogeneity for forming a magnetic resonance image is provided. A magnetic resonance excitation is applied. A plurality of k-space echoes signals is acquired. A periodic cost function is calculated from the acquired plurality of k-space echo signals. A period of the calculated periodic cost function is divided into multiple regions. A search algorithm is used to locate a local minimum in each region. Located local minimums are chosen to provide global smoothness.

18 Claims, 7 Drawing Sheets

MAGNETIC RESONANCE FIELD MAP ESTIMATION FOR SPECIES SEPARATION

GOVERNMENT RIGHTS

This invention was made with Government support under contracts NIH-RR009784-11, NIH-EB002524-01 and NIH-HL075803-01 awarded by the National Institutes of Health. The Government has certain rights in this invention.

BACKGROUND OF THE INVENTION

This invention relates generally to magnetic resonance imaging (MRI), and more particularly, the invention relates to field map estimation from multi-echo MRI sequences.

Magnetic resonance imaging (MRI) is a non-destructive method for the analysis of materials and is an approach to medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Magnetic resonance (MR) imaging is based on nuclear spins, which can be viewed as vectors in a three-dimensional space. During an MRI experiment, each nuclear spin responds to four different effects: precession about the main magnetic field, nutation about an axis perpendicular to the main field, and both transverse and longitudinal relaxation. In steady-state MRI experiments, a combination of these effects occurs periodically.

Reliable and uniform fat suppression in MRI is clinically important, as fat signals appear bright in many fast imaging sequences, such as fast spin echo, spoiled gradient echo, and balanced SSFP. Unless suppressed, bright fat signals may obscure underlying pathology, degrading the diagnostic value of MR images. Common fat suppression techniques include fat saturation, spectral-spatial water selective excitation, STIR (short-tau inversion recovery, and water-fat separation methods based on chemical-shift induced phase differences. The latter group of methods, deriving from the two-point Dixon method, are less susceptible to magnetic field ($B_0$) inhomogeneities, since field inhomogeneities can be corrected before separation. The potential to correct for field inhomogeneities has led to many variations of multi-point water-fat separation methods.

SUMMARY OF THE INVENTION

In accordance with the invention, a method for mapping field inhomogeneity for forming a magnetic resonance image is provided. A magnetic resonance excitation is applied. A plurality of k-space echoes signals is acquired. A periodic cost function is calculated from the acquired plurality of k-space echo signals. A period of the calculated periodic cost function is divided into multiple regions. A search algorithm is used to locate a local minimum in each region. Located local minimums are chosen to provide global smoothness.

In another manifestation of the invention, a computer implemented method for generating magnetic resonance images is provided. An inhomogeneity field map is generated, comprising applying a magnetic resonance excitation, acquiring a plurality of k-space echoes signals, calculating a periodic cost function from the acquired plurality of k-space echo signals, dividing a period of the calculated periodic cost function into multiple regions, using a search algorithm to locate a local minimum in each region, choosing located local minimums to provide global smoothness, and progressively growing the field map from the local minimums. The field map is used to provide a corrected magnetic resonance image with species separation.

In another manifestation of the invention a magnetic resonance imaging apparatus is provided. A magnetic resonance imaging excitation and detection system is provided. A controller is electrically connected to the magnetic resonance imaging excitation and detection system and comprises a display, at least one processor, and computer readable media. The computer readable media comprises computer readable code for generating an inhomogeneity field map, comprising computer readable coded for applying a magnetic resonance excitation, computer readable code for acquiring a plurality of k-space echoes signals, computer readable code for calculating a periodic cost function from the acquired plurality of k-space echo signals, computer readable code for dividing a period of the calculated periodic cost function into multiple regions, computer readable code for using a search algorithm to locate a local minimum in each region, computer readable code for choosing located local minimums to provide global smoothness, and computer readable code for progressively growing the field map from the local minimums. The computer readable media further comprises computer readable code for using the field map to provide a corrected magnetic resonance image with species separation and computer readable code for displaying the magnetic resonance image on the display.

The invention and objects and features thereof will be more readily apparent from the following detailed description and appended claims when taken with the drawings.

BRIEF DESCRIPTION OF THE DRAWINGS

These overlapping intervals are denoted as Region 1, Region 2, and Region 3 as shown in FIG. 1(b).

DETAILED DESCRIPTION OF ILLUSTRATED EMBODIMENTS

In contrast to many multi-point methods that require fixed echo shifts, the IDEAL (iterative decomposition of water and fat with echo asymmetry and least squares estimation) method separates water and fat using an iterative least-squares approach. This method allows great flexibility of echo times, which can be selected to achieve optimal noise performance. Reliable field map estimation is an essential ingredient of the IDEAL method. Yu H, Reeder S B, Shimakawa A, Brittain J H, Pelc N J, in "Field map estimation with a region growing scheme for iterative 3-point water-fat decomposition," Magn Reson Med 2005; 54:1032-1039, proposed a region-growing method, which greatly improves the robustness of field map estimation by exploiting the correlations between neighboring pixels. Various heuristics have been applied, including seed-pixel selection for region growing and weighted linear fitting in local sliding windows. The aim of the heuristics is to begin the iteration at each pixel with an initial guess close to the true value.

Multi-point methods require multiple images for estimating field inhomogeneity map or field map. This results in prolonged imaging time and suboptimal imaging efficiency. To improve imaging efficiency, multiple echoes can be acquired in a single repetition (TR). Such sequences are referred to as "multi-echo sequences." They are less sensitive to subject motion and potentially enable highly SNR-efficient imaging. However, the echo-spacings (ΔTEs), such as the time of the second echo $TE_2$ minus the time of the first echo $TE_1$ to find the time between echoes, in multi-echo sequences are necessarily longer than those in single-echo sequences given the same prescribed receiver bandwidth and spatial resolution. The robustness of field map estimation is impaired by long ΔTE, as chemical-shift-induced and field-inhomogeneity induced phase differences accrued during ΔTE are large enough to create ambiguity in resolving field inhomogeneities. Such challenges are further exacerbated at high field strengths, where both chemical shift and field inhomogeneities are increased proportionally. Therefore, the application of existing multi-point methods to multi-echo sequences is still limited.

Yu H, Reeder S B, Shimakawa A, Brittain J H, Pelc N J, in "Field map estimation with a region growing scheme for iterative 3-point water-fat decomposition," Magn Reson Med 2005; 54:1032-1039, which is incorporated by reference, discusses cost functions. The invention relates to cost functions associated with the least-squares field map estimates. The key insight is that the cost function has a fundamental period 1/ΔTE. By analyzing the characteristics of the cost function, it has been found that long echo-spacing leads to less reliable field map estimation. The invention provides a field map estimation method that directly locates possible field map values with a golden section search. The field map is obtained by choosing from the possible field map values with a smoothness constraint. To reduce computational cost and improve the robustness of field map estimation, an embodiment of the invention incorporates a multi-resolution pyramidal structure that exploits the smoothly varying nature of field maps. The embodiment of the invention enables efficient and reliable water-fat separation with multi-echo sequences where long echo-spacings impose great challenge on reliable field map estimation.

Ideally, an embodiment would provide a cost (error) function that completely minimizes the error in estimating field inhomogeneity, so that the error is 0 Hz. However, some error will result. It would then be desirable that the error for a period be centered at 0 Hz.

Theory

Let $I_n$ denote the images acquired at n echo times, $TE_n$. For example, n=1, 2, 3 for three-point methods, in a Dixon or IDEAL process, as described in Glover G H in "Multipoint Dixon technique for water and fat proton and susceptibility imaging," J Magn Reson Imaging 1991; 1:521-530 and Reeder S B, Hargreaves B A, Yu H, Brittain J H in "Homodyne reconstruction and IDEAL water-fat decomposition." Magn Reson Med 2005; 54:586-593. Each pixel at the location (x, y) of the acquired image, $I_n(x, y)$, has a complex signal value that depends on the corresponding voxel's proton density, composition of chemical species, field inhomogeneity, and the echo time $TE_n$. When the echo times are much shorter than the $T_2$s of the tissues present, the magnitude difference due to $T_2$ decay between acquisitions can be ignored. The following signal model takes into account the aforementioned factors: (assume n=1, 2, 3 and two chemical species, water and fat)

$$\underbrace{\begin{pmatrix} I_1(x, y) \\ I_2(x, y) \\ I_3(x, y) \end{pmatrix}}_{S(x,y)} = \underbrace{\begin{pmatrix} e^{j2\pi\psi(x,y)TE_1} & 0 & 0 \\ 0 & e^{j2\pi\psi(x,y)TE_2} & 0 \\ 0 & 0 & e^{j2\pi\psi(x,y)TE_3} \end{pmatrix}}_{\Psi(\psi(x,y))} \underbrace{\begin{pmatrix} 1 & e^{j2\pi\Delta fTE_1} \\ 1 & e^{j2\pi\Delta fTE_2} \\ 1 & e^{j2\pi\Delta fTE_3} \end{pmatrix}}_{A} \underbrace{\begin{pmatrix} W(x, y) \\ F(x, y) \end{pmatrix}}_{\Gamma(x,y)}, \quad (1)$$

where S(x, y) denotes the "echo signal vector", Ψ(ψ(x, y)) the "field map matrix", A the "chemical shift matrix" (Δf≈−210 Hz at 1.5 T is the chemical shift between water and fat signals), and Γ(x, y) the "signal vector" (W (x, y) and F (x, y) are complex water and fat signal values.) Given the field map matrix Ψ(ψ(x, y)), (ψ(x, y) is an estimate of the field map value at (x, y)), the signal vector can be found optimally in a least-squares sense by solving $$\hat{\Gamma}(x, y) = A^\dagger \Psi(\hat{\psi}(x, y))^{-1} S(x, y), \quad (2)$$

where $A^\dagger = (A^T A)^{-1} A^T$ and $\Psi(\psi(x, y))^{-1}$ is a diagonal matrix with diagonal entries $$\begin{bmatrix} e^{-j2\pi\hat{\psi}(x,y)TE_1} & e^{-j2\pi\hat{\psi}(x,y)TE_2} & e^{-j2\pi\hat{\psi}(x,y)TE_3} \end{bmatrix}.$$

Figure 1A:
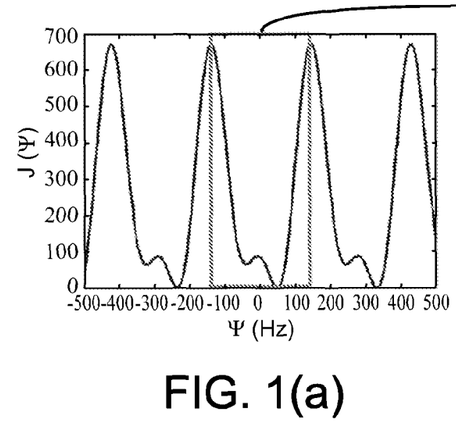
FIG. 1(a) shows one typical plot of $J(\psi)$ associated with estimating the field map value Ã.

With reference to Equation 2, a least-squares estimate of the signal vector is associated with an estimation error. This error can be defined as a cost function J for the estimate of the field map value. The cost function is given by $J(\psi(x, y)) = \|(AA^\dagger - I)\Psi(\psi(x, y))^{-1} S(x, y)\|$. For notational simplicity, the location index (x, y) is dropped to reflect the dependence of J and Ψ on the estimated field map. FIG. 1(a) shows one typical plot of J(ψ̂) associated with estimating the field map value ψ. J(ψ̂) is periodic with a fundamental period 1/ΔTE and has multiple local minima within one period, which was acquired from a bone-marrow voxel of a lower-leg study at 3 T. (The imaging parameters of this lower-leg study are presented in the Experimental method section.) $J(\hat{\psi})$ has multiple local minima and is periodic; the periodicity can be understood by examining the following:

$$J(\hat{\psi}) = \left\| (AA^\dagger - I) \begin{pmatrix} 1 & 0 & 0 \\ 0 & e^{-j2\pi\hat{\psi}(TE_2-TE_1)} & 0 \\ 0 & 0 & e^{-j2\pi\hat{\psi}(TE_3-TE_1)} \end{pmatrix} S(x,y) \right\| \quad (3)$$

$$\left\| e^{-j2\pi\hat{\psi}TE_1} \right\|$$

$$= \left\| (AA^\dagger - I) \begin{pmatrix} 1 & 0 & 0 \\ 0 & e^{-j2\pi(\hat{\psi}+\frac{1}{\Delta TE})(\Delta TE)} & 0 \\ 0 & 0 & e^{-j2\pi(\hat{\psi}+\frac{1}{\Delta TE})(2\Delta TE)} \end{pmatrix} S(x,y) \right\|$$

$$= J\left(\hat{\psi} + \frac{1}{\Delta TE}\right)$$

where $\Delta TE$ denotes an equal echo-spacing, i.e., $\Delta TE = TE_2 - TE_1 = TE_3 - TE_2$. Equation 3 shows that the cost function has a fundamental period of $1/\Delta TE$. Hence, the longer the echo-spacing $\Delta TE$, the narrower the range of field map values that can be resolved without aliasing. It is also important to realize that the global minimum in one period is not necessarily the best choice. Simply minimizing the cost function J without considering overall smoothness of the field map $\psi$ inevitably impairs the robustness of field map estimation.

Methods

To improve the computational efficiency and address the problems caused by long echo-spacings, a novel method for estimating field maps from images acquired at multiple echo times is provided by an embodiment of the invention. The main contributions of this embodiment are:

a field map estimation method based on multiple golden section searches and progressive field map growth;

a multi-resolution pyramidal structure that significantly reduces computational cost and improves the robustness of the field map estimation.

First, the field map estimation method using golden section searches will be presented, followed by the multi-resolution pyramidal structure that enables coarse-to-fine field map propagation.

Field Map Estimation Using Golden Section Searches

Figure 2:
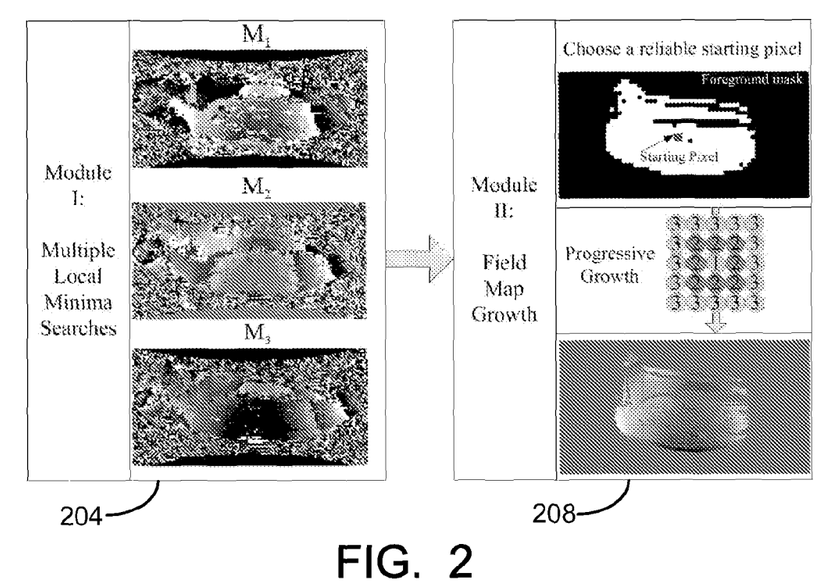
FIG. 2 shows a flowchart of the proposed field map estimation method using leg images obtained from a 3 T scanner.

FIG. 2 shows a flowchart of the proposed field map estimation method using leg images obtained from a 3 T scanner as an example. Module I (multiple local minima searches) 204 limits the search of the field map values to one period of the cost function. Multiple local minima within a single period are located by applying multiple golden section searches. Press W H, Teukolsky S A, Vetterling W T, Flannery B P, in "Numerical Recipes in C," Cambridge University Press, New York, N.Y., 2nd ed., 1994, which is incorporated by reference discusses methods of using golden section searches to find local minima. Upon completion of Module I, several possible field map values are identified for each pixel, only one of which will be selected by Module II (field map growth) 208. Specifically, Module II first identifies a starting pixel whose field map estimate is deemed to be reliable. Subsequently, the field map is progressively grown from the starting pixel to avoid abrupt change between neighboring field map values. The resulting field map strives for two objectives: minimizing the least-squares estimation error J, and maintaining overall smoothness of the field map $\psi$. The two modules are described in detail below.

Module I: Multiple Local Minima Searches

Figure 1B:
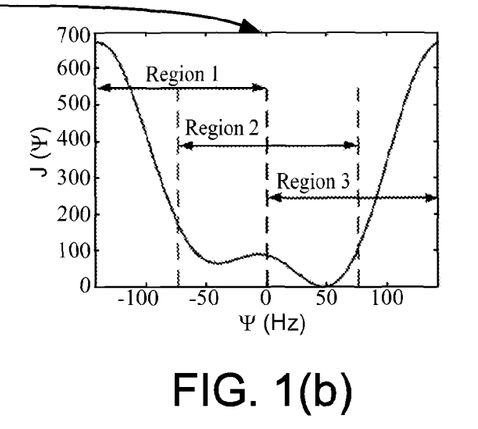

As discussed in the Theory section, the cost function $J(\psi)$ defined in Equation 3 is periodic with the fundamental period $1/\Delta TE$. In addition, the cost function $J(\psi)$ is slowly varying with few local minima in one period. It has been unexpectedly found that $J(\psi)$ always has no more than 3 local minima in one period. Hence, the interval into three overlapping intervals $[-\frac{1}{2}\Delta TE, 0]$, $[-\frac{1}{4}\Delta TE, \frac{1}{4}\Delta TE]$, and $[0, \frac{1}{2}\Delta TE]$. These overlapping intervals are denoted as Region 1, Region 2, and Region 3 as shown in FIG. 1(b).

A golden section search is applied to locate the minimum bracketed inside each of the three overlapping intervals. Specifically, a minimum of a one-dimensional function $f(\cdot)$ is known to be bracketed in an interval (a, c) if and only if for a triplet of points, $a<b<c$, $f(b)<f(a)$ and $f(b)<f(c)$. In short, the golden section search starts with an interval that brackets a minimum and guarantees that each new function evaluation brackets the minimum to an interval of half size of the preceding interval. If one of the overlapping intervals does not satisfy the criterion of bracketing a minimum, the local minimum found in its adjacent overlapping region will be chosen. The local minimum found in Region i is denoted as $m_i$ where $m_1 \leq m_2 \leq m_3$. These local minima form the initial field map estimates $M_1$, $M_2$, and $M_3$ shown in FIG. 2.

The field inhomogeneities considered in our implementation extends from $-500$ Hz to $500$ Hz at $1.5$ T or $-1000$ Hz to $1000$ Hz at $3$ T, which corresponds to the entire range of spectral shifts ($\approx \pm 7.8$ ppm) and the degree of $B_0$ field inhomogeneities present in modern super-conducting MRI equipment. As the field inhomogeneities can extend multiple periods, the replicas of $\{m_1, m_2, m_3\}$ must be taken into account, which are the local minima outside $[-\frac{1}{2}\Delta TE, \frac{1}{2}\Delta TE]$. The replicas can be obtained by adding multiple $1/\Delta TE$ s to $\{m_1, m_2, m_3\}$ accordingly. For example, 3.2 ms echo-spacing at $1.5\sim$T gives $312.5$ Hz fundamental period of the cost function and the local minima $\{m_1, m_2, m_3\} = \{-20, -20, 110\}$ Hz are located inside the interval $[-156.25, 156.25]$ Hz; the replicas of $\{m_1, m_2, m_3\}$ considered insider $[-500, 500]$ Hz are $\{-332.5, -332.5, -202.5\}$ Hz and $\{292.5, 292.5, 422.5\}$ Hz. The selection of the optimal field map value from the local minima set ($\{m_1, m_2, m_3\}$ and their replicas) needs to take into account spatial smoothness. That is, the selection of field map value should not only minimize the cost function $J(\psi)$ but also maintain smoothness of the overall field map. The second objective is addressed by Module II 208.

Module II: Field Map Growth

Upon completion of Module I, three possible field map values in the interval $[-\frac{1}{2}\Delta TE, \frac{1}{2}\Delta TE]$ are identified for each pixel. Module II seeks to select from these values and their replicas for each pixel such that the resulting field map is smoothly varying. To this end, a starting pixel whose field map estimate is deemed to be reliable is identified. Specifically, the starting pixel satisfies two criteria: (1) its spatial location resides in a place where the shim or field homogeneity is known to be good; and (2) its field map estimate agrees with those of the majority of other pixels.

In this embodiment of the invention, the first criterion is met by enforcing the starting pixel to be spatially close to the centroid of a foreground mask. The foreground mask is obtained by labeling each pixel whose magnitude is greater than the tenth-percentile of all pixels' magnitude. The second criterion requires the starting pixel's field map estimate to be numerically close to the median value of all field map estimates in the interval $[-\frac{1}{2}\Delta TE, \frac{1}{2}\Delta TE]$. The first criterion has been adopted by other region-growing algorithms to select the starting pixel. The second criterion relies on two observations: (1) under most shimmed conditions with center frequency tuned to water, the field inhomogeneity expected from a location with good shim lies within the interval $[-\frac{1}{2}\Delta TE, \frac{1}{2}\Delta TE]$ (for example, a very long echo-spacing 4 ms corresponds to the interval $[-125, 125]$ Hz); and (2) the three possible field map values are not unique for many pixels (for example, $m_1=m_2=m_3$ if only one minimum is in the interval). The global median of the local minima obtained from Module I is essentially a weighted median of possible field map values within the interval $[-\frac{1}{2}\Delta TE, \frac{1}{2}\Delta TE]$, which is a robust estimate of the true field map values of the pixels with good shim.

The starting pixel is then used as the $1^{st}$ contour in a region-growing algorithm shown in FIG. 2, where the field map is progressively grown to avoid abrupt change between neighboring field map values. Given field map values of pixels in the $k^{th}$ contour, the $(k+1)^{th}$ contour is constructed as follows: for a pixel p in the $(k+1)^{th}$ contour, denote its nearest neighboring pixel in the $k^{th}$ contour as $\bar{p}$. The field map value of p is chosen to be the value in its local minima set ($\{m_1,m_2,m_3\}$ and their replicas) closest to that of $\bar{p}$. By taking the replicas of $\{m_1,m_2,m_3\}$ into account, the region-growing algorithm handles large field inhomogeneity outside the interval $[-\frac{1}{2}\Delta TE, \frac{1}{2}\Delta TE]$.

Multi-resolution Pyramidal Structures

As seen from the final field map produced by Module II in FIG. 2, this embodiment does well in producing a smoothly varying field map. However, two major concerns remain. First, the proposed method incurs unnecessary computational cost when directly applied to full-resolution image data. Due to the smoothly varying nature of field maps, this embodiment results in similar field map values for neighboring pixels. This suggests that great computational cost can be saved by applying the proposed method to down-sampled image data. Second, there is no feedback mechanism that verifies the accuracy of field map estimates and refines the estimates if some deviate from the correct values.

To address both concerns, a multi-resolution pyramidal structure is used in this embodiment. Let $\psi^l$ denote a field map at level l, where l=1 is defined as the finest resolution. Each pixel at the $l^{th}$ resolution corresponds to a group of 4 pixels at the $(l-1)^{th}$ resolution. In addition to the pyramidal structure containing multi-resolution field maps, this embodiment uses a pyramidal structure to store the image data. Using 512×512×3 image data acquired at three echo times as an example, this embodiment reduced the resolution of the data using nearest neighbor down-sampling and generate image data with resolutions of 256×256×3, . . . , 64×64×3. Note that the coarsest resolution in the current implementation is one-eighth of the full resolution, which generally maintains sufficient spatial information for field map estimation.

Given the multi-resolution pyramidal structure, this embodiment only applies the field map estimation using golden section searches at the coarsest level to produce a low-resolution field map. For each subsequent level, $\hat{\psi}_c$ denotes the field map obtained from its previous coarser level. $\hat{\psi}_c$ is magnified by a factor of 2 to $\hat{\psi}_{f,init}$ using bilinear interpolation as described in Jain A, "Fundamentals of Digital Image Processing" Prentice-Hall Press, 1989; $\hat{\psi}_{f,init}$ serves as an initial field map estimation for the current resolution. For each pixel in the current resolution, the cost function $J(\hat{\psi}_{f,init})$ (Equation 3) indicates how accurate the initial estimate is and classifies the pixel into one of the following three groups:

1) the initial field estimate is accurate if $J(\hat{\psi}_{f,inst}) \leq \delta_1$
2) the initial field estimate needs to be refined if $\delta_1 \leq J(\hat{\psi}_{f,inst}) \leq \delta_2$
3) the initial field estimate is not useful if $J(\hat{\psi}_{f,inst}) > \delta_2$ $\delta_1$ and $\delta_2$ are set such that most pixels belong to the first two groups, whereas pixels residing along boundaries and interfaces between tissues fall into the third group. In this embodiment, empirically setting $\delta_1$ and $\delta_2$ to be 10% and 50% of the pixels' magnitude achieves a good tradeoff between gain in computational efficiency and refinement of field maps.

While no further refinement is needed for the first group of pixels, the initial field map value of the pixel in the second group, $\hat{\psi}_{f,init}$ is refined by a golden section search in the interval $[\hat{\psi}_{f,init}-\frac{1}{4}\Delta TE, \hat{\psi}_{f,init}+\frac{1}{4}\Delta TE]$. The first two groups of pixels should be filled in at the current resolution before filling in the pixels in the third group. For the third group of pixels, their initial field map values must be filled in by taking the field map smoothness into consideration. A simple yet effective strategy is to use the field map values of the nearest neighboring pixels in the first two groups as the initial estimates for further refinement. Once the initial estimates are available, the field map values of the pixels in the third group are computed using the same golden section search as the pixels in the second group. By utilizing the reliable field map values of neighboring pixels (i.e., the first group and the refined second group), the refinement of the third group of pixels is able to correct the erroneous field map estimations from the coarser level.

Figure 3:
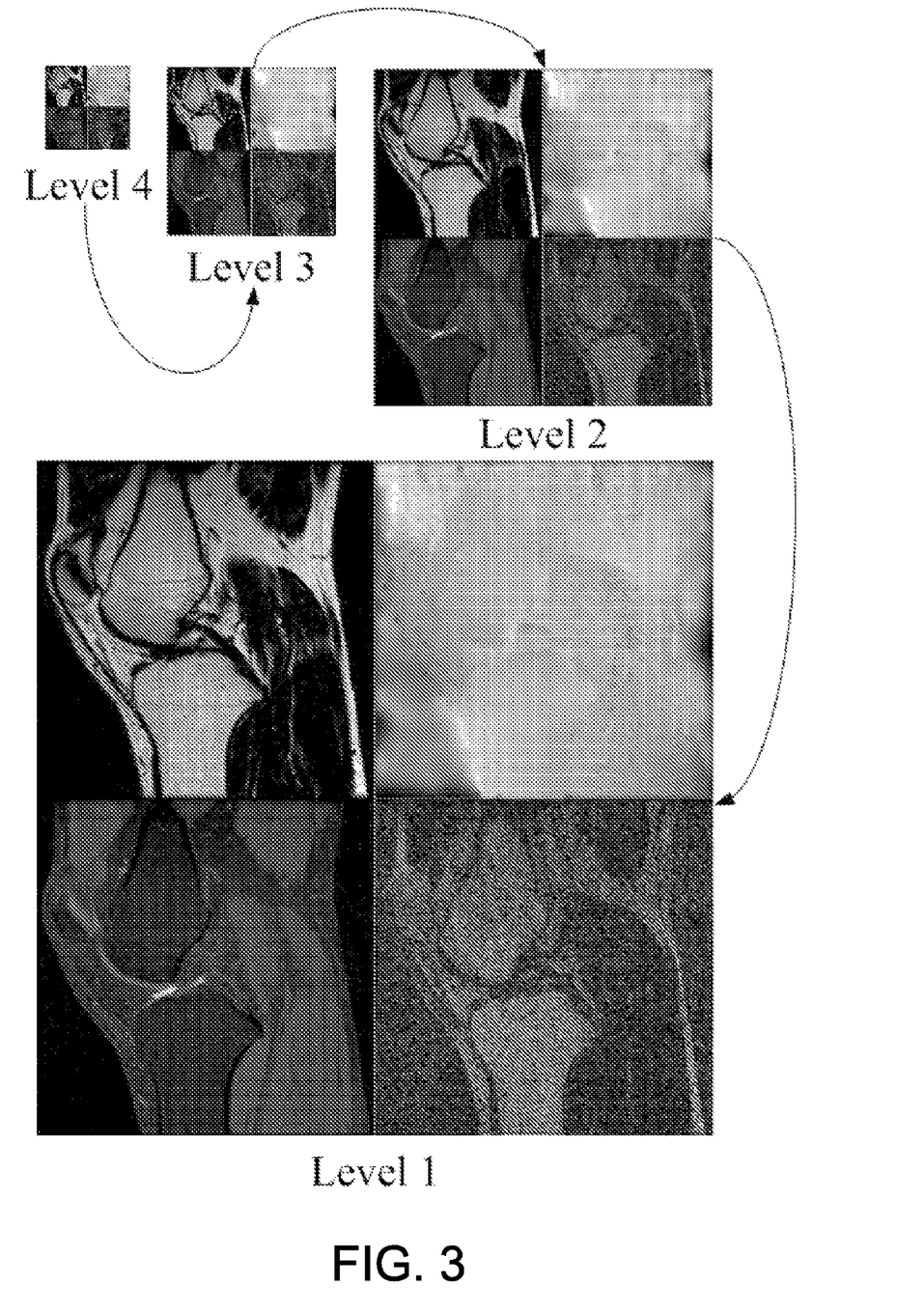
FIG. 3 shows intermediate results generated from the coarse-to-fine field map refinement, where an initial field map obtained at the coarsest level is subject to a coarse-to-fine refinement. For each level, the intermediate result consists of four images: fat (top left), water (bottom left), field map (top right), and estimation error (bottom right).

The coarse-to-fine field map propagation is carried out for each resolution level until the full-resolution field map is obtained. Given the field map, the water-fat separation is done by the least-squares estimation given in Equation 2. FIG. 3 shows intermediate results generated from the coarse-to-fine field map refinement, where the proposed field map estimation is only carried out at the coarsest level 4. For each level, the intermediate result consists of four images: fat (top left), water (bottom left), field map (top right), and estimation error (bottom right). As can be seen from this example, the proposed multi-resolution pyramidal structure enables successive generation of a reliable field map at each level, which yields well-separated water and fat images.

Experimental Methods

With approval from the Institutional Review Board of Stanford and informed consent from each subject, volunteer data were acquired using 1.5 T and 3 T scanners (GE Healthcare Technologies, Milwaukee, Wis., USA). To validate the ability of the proposed method in handling long echo-spacings, several anatomical regions were scanned with multi-echo sequences, where the phase difference between water and fat accrued during the $\Delta TE$ is greater than $\pi$. Images were acquired in three anatomical regions (lower leg, liver and ankle). For these studies, the echo-times were chosen to achieve near-optimal noise performance. Methods for each study are given in more detail below.

Flow-independent Angiography

Non-contrast enhanced flow-independent angiography is an area of great interest and active research. It has been shown that dual-acquisition SSFP produces good angiographic contrast while mitigating signal nulls due to off-resonance. A dual-acquisition SSFP sequence was used to scan the lower leg of a healthy volunteer at 3 T. A quadrature extremity coil (Medical Advances, Milwaukee, Wis., USA) was used with the following imaging parameters: $TE_{1,2,3}$=2.3, 5.3, 8.4 ms, acquisition matrix 512×256×128, FOV=24×12×12 cm, receiver bandwidth ±81.3 kHz, TR=11.8 ms, and flip angle of 30°. Complex images acquired from the two acquisitions were first summed and then processed by this embodiment of the invention to produce separated water and fat images. The separated water images of this 3D scan were then subject to maximum-intensity-projection (MIP) for the depiction of arterial structure.

Liver Imaging with Reduced Breath-hold

Breath-held liver imaging is an important application that requires rapid and high-resolution imaging in the presence of significant field inhomogeneities. As multi-echo sequences greatly reduce the scan time needed for field map estimation, one application is abdominal imaging with reduced breath-hold duration. A multi-echo GRE sequence was used to scan the liver of a healthy volunteer at 1.5 T. An 8-channel coil was used with the following imaging parameters: $TE_{1,2,3}$=3.5, 6.7, 9.8 ms, acquisition matrix 256×144×28 with phase FOV ratio 0.75, FOV=40×30×4 cm, receiver bandwidth ±41.5 kHz, TR=14 ms, and flip angle of 10°. The entire liver volume was imaged during a 42-second breath-hold without using parallel imaging. For this 3D liver study, the data from each coil was processed separately using an embodiment of the invention, and the separated water/fat images of multiple coils were then combined using sum-of-squares.

Ankle Imaging at High Field

Water-fat separation of ankle scans at 3 T is challenging due to large field inhomogeneities from inadequate shim and/ or susceptibility variations. We used a multi-echo GRE sequence to scan the ankle of a healthy volunteer at 3 T. A quadrature extremity coil was used with the following imaging parameters: TE1,2,3=3.2, 5, 6.8 ms, acquisition matrix 256×256×64, FOV=20×20×5 cm, receiver bandwidth ±83.3 kHz, TR=11 ms, and flip angle of 10°.

Water-fat separation was performed for all three studies using the proposed method implemented in Matlab (Mathworks, Natick, Mass., USA). The separated water/fat images and estimated field maps are presented in the following section.

Results

Figure 4A:
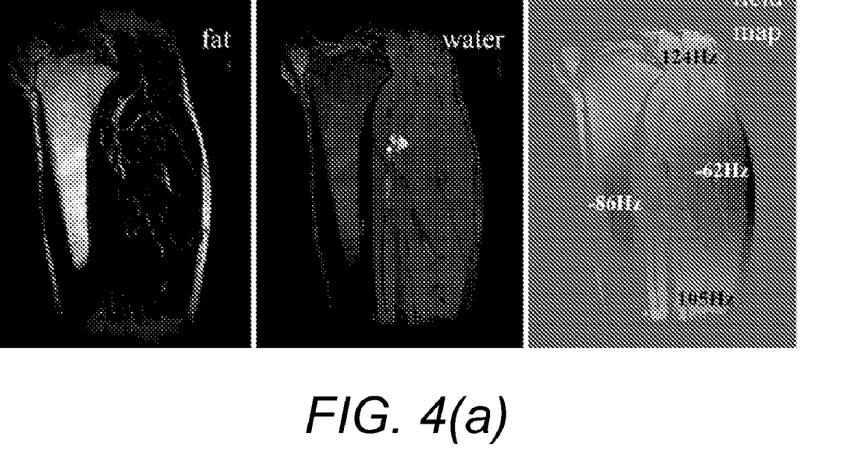
FIGS. 4(a)-(b) shows the separated water/fat images and the estimated field map of one sample slice and the Sagittal and Coronal maximum intensity projections (MIP) of the water images of a 3D non-contrast-enhanced angiographic bSSFP lower-leg study at 3 T.
Figure 4B:
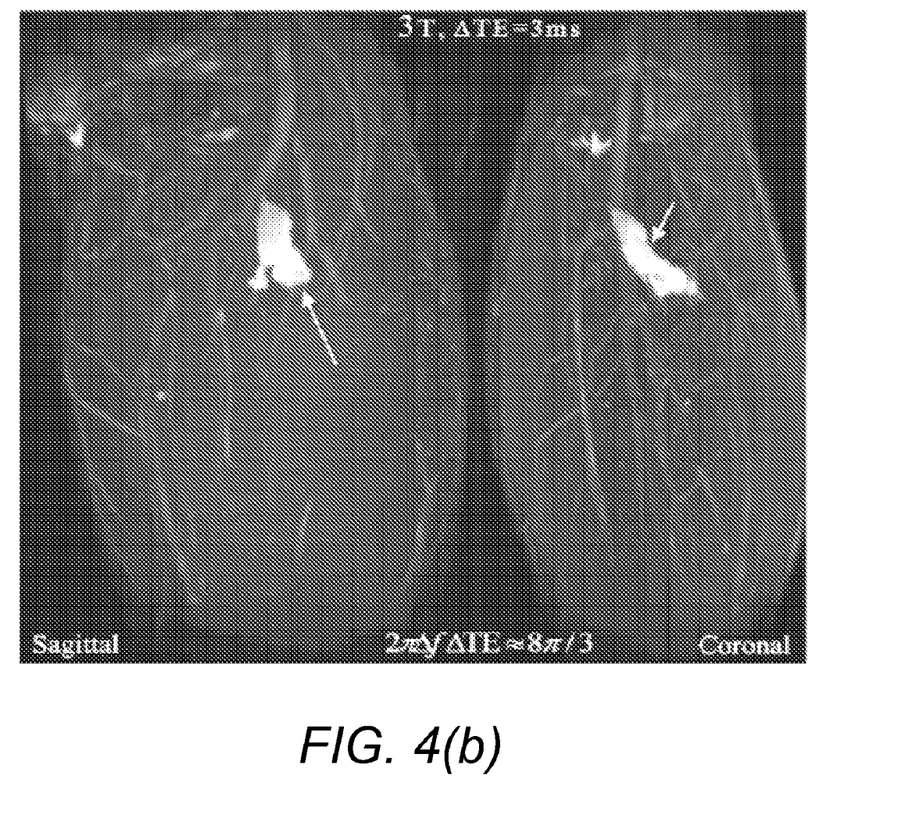

FIG. 4(a) shows the separated water/fat images and the estimated field map of one sample slice, and FIG. 4(b) the Sagittal and Coronal maximum intensity projections (MIP) of the water images of a 3D non-contrast-enhanced angiographic bSSFP lower-leg study at 3 T. The sample field map values show the field inhomogeneity present in this embodiment. Imaging parameters: $TE_{1,2,3}$=2:3; 5:3; 8:4 ms, acquisition matrix 512×256×128, FOV=24×12×12 cm, receiver bandwidth ±81:3 kHz, TR=11:8 ms, and flip angle of 30°. The echo-spacing in this study is 3 ms, which leads to 8π/3 phase difference between water and fat through ΔTE. Excellent water and fat separation enables good depiction of the arterial structure from the lower-leg study at 3 T, as shown in FIG. 4(b). Despite a very long echo-spacing ΔTE=3 ms at 3 T, this embodiment correctly estimated the large field-map variations across the slice (ranging from −86 Hz to 124 Hz). The bright residue in the MIP images is a cyst (noted by arrows).

Figure 5:
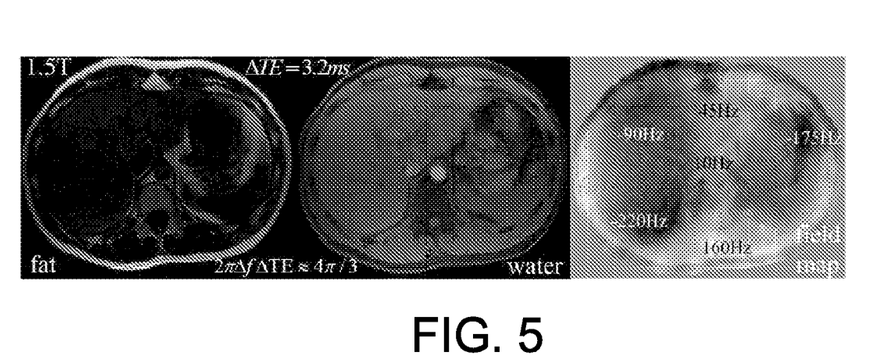
FIG. 5 shows representative axial slice from the abdomen study at 1.5 T.

A representative axial slice from the abdomen study at 1.5 T is shown in FIG. 5. The entire liver volume was covered in a 42-second breath-hold, and uniform water and fat separation is achieved for all slices. In this case an echo-spacing ΔTE=3.2 ms at 1.5 T leads to approximately 4π/3 phase difference between water and fat. The sample field map values show the field inhomogeneities present in this embodiment. Imaging parameters: $TE_{1,2,3}$=3.5; 6:7; 9:8 ms, acquisition matrix 256×144×28 with phase FOV ratio 0:75, FOV=40×22×4 cm, receiver bandwidth ±41:5 kHz, TR=14 ms, and flip angle of 10°.

Figure 6:
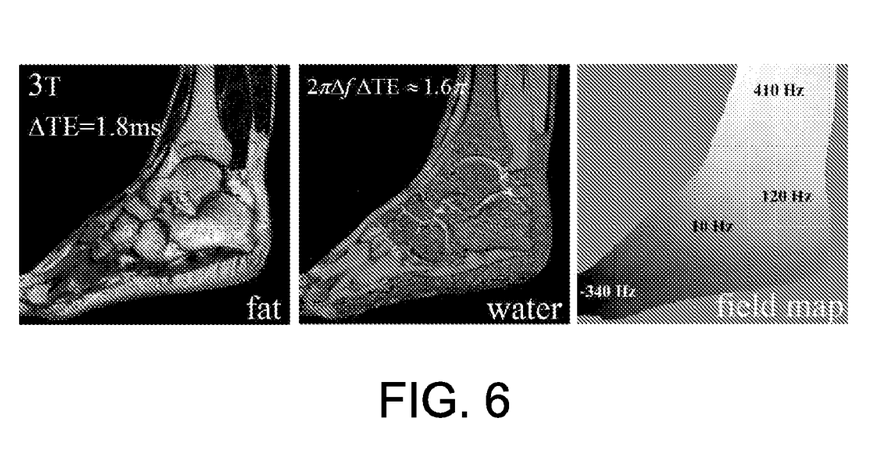
FIG. 6 shows the fat/water separation results of the ankle study at 3 T.

FIG. 6 shows the fat/water separation results of the ankle study at 3 T. In this case an echo-spacing ΔTE=1.8 ms at 3 T leads to approximately 8π/5 phase difference between water and fat, and one period of the cost function only extends from −277 Hz to 277 Hz. Imaging parameters are: $TE_{1,2,3}$=3:2; 5; 6:8 ms, acquisition matrix 256×256×64, FOV=20×20×5 cm, receiver bandwidth ±81:3 kHz, TR=11 ms, and flip angle of 10°. The estimated field map of this ankle study demonstrates the efficacy of the proposed method in resolving large field map inhomogeneities, which ranges from −340 Hz to 410 Hz. As can be seen from the separation results of these two studies with long echo-spacings, this embodiment enabled uniform water-fat separation.

Discussion

As described in the Theory section, a long echo-spacing results in a short period of the cost function and closely spaced local minima. As a result of the longer the echo-spacings, the more likely that iterative searches locate erroneous local minima. Inspired by this problem, an embodiment of the invention may provide a field map estimation method that directly locates possible field map values using golden section searches. The local minima found in the three overlapping intervals together with their replicas cover the entire range of spectral shifts and the degree of $B_0$ field inhomogeneities present in modern super-conducting MRI equipment. The refinement of the initial field map is incorporated in the multi-resolution pyramidal structure, which exploits the smoothly varying nature of field maps. During the coarse-to-fine field map propagation, the erroneous values in the initial field map are corrected with the aid of their neighboring field map values.

The multi-resolution field map estimation using golden section searches is computationally efficient. A non-optimized MATLAB implementation of an embodiment of the invention running on an IBM Thinkpad with 1.86 GHz Intel Pentium M processor and 1 GB memory generates separated water and fat images of matrix size 256×256 in around 40 seconds. The gain in computation speed stems from effectively exploiting the periodicity of the cost function $J(\psi)$ as well as field map smoothness. In comparison to the IDEAL method, the proposed method does not require repeated smearing followed by the re-estimation of field map values. Instead, the proposed method enforces the smoothness constraint by selecting from the local minima set. The local minima set are efficiently located by a golden section searches. A golden section search is a logarithmic algorithm, such as described in Knuth D, "The Art of Computer Programming, Vol. 3: Sorting and Searching". Addison-Wesley, 3rd ed., 1997. The golden section search is a technique for finding the extremum (minimum or maximum) of a unimodal function by successively narrowing the range of values inside which the extremum is known to exist. The technique derives its name from the fact that the algorithm maintains the function values for triples of points whose distances form a golden ratio. Specifically, given a search interval N Hz and the desired field map precision 1 Hz, it takes O(log N) steps to converge. The computational gains are critically important for quickly processing large amount of MRI data, especially when multi-coil 3D scans are employed.

Other embodiments can easily be extended to separate multiple chemical species, such as water, fat, and silicon, by enlarging the dimension of the "echo signal vector", the "field map matrix", the "chemical shift matrix", and the "signal vector" in the signal model (Equation 1), accordingly. The extension to handle multi-coil data is also straightforward. FIG. 5 shows the separation results obtained using the multi-coil extension of the proposed method. The proposed method can also be incorporated with fast imaging techniques, such as partial k-space acquisition and parallel imaging. Furthermore, the robustness of the field map estimation can be improved by exploiting the spatial redundancy offered by multiple coils.

In conclusion, reliable field map estimation remains a difficult problem, as there is inherent ambiguity in determining field map values for each pixel. Similar to previous works, the proposed method relies on region-growing for computational tractability. Therefore, the method is susceptible to the wrong field map value of the starting pixel, which can lead to the failure of the estimation. The heuristics used for selecting the starting pixel may not hold in some extreme cases, such as incorrect center frequency. Nevertheless, uniformly separated water-and fat-only images of different anatomical regions that were imaged using multi-echo sequences with long echo-spacings demonstrate the feasibility and potential utility of various embodiments of the invention.

Flow Chart of a Magnetic Resonance Imaging Embodiment

Figure 7:
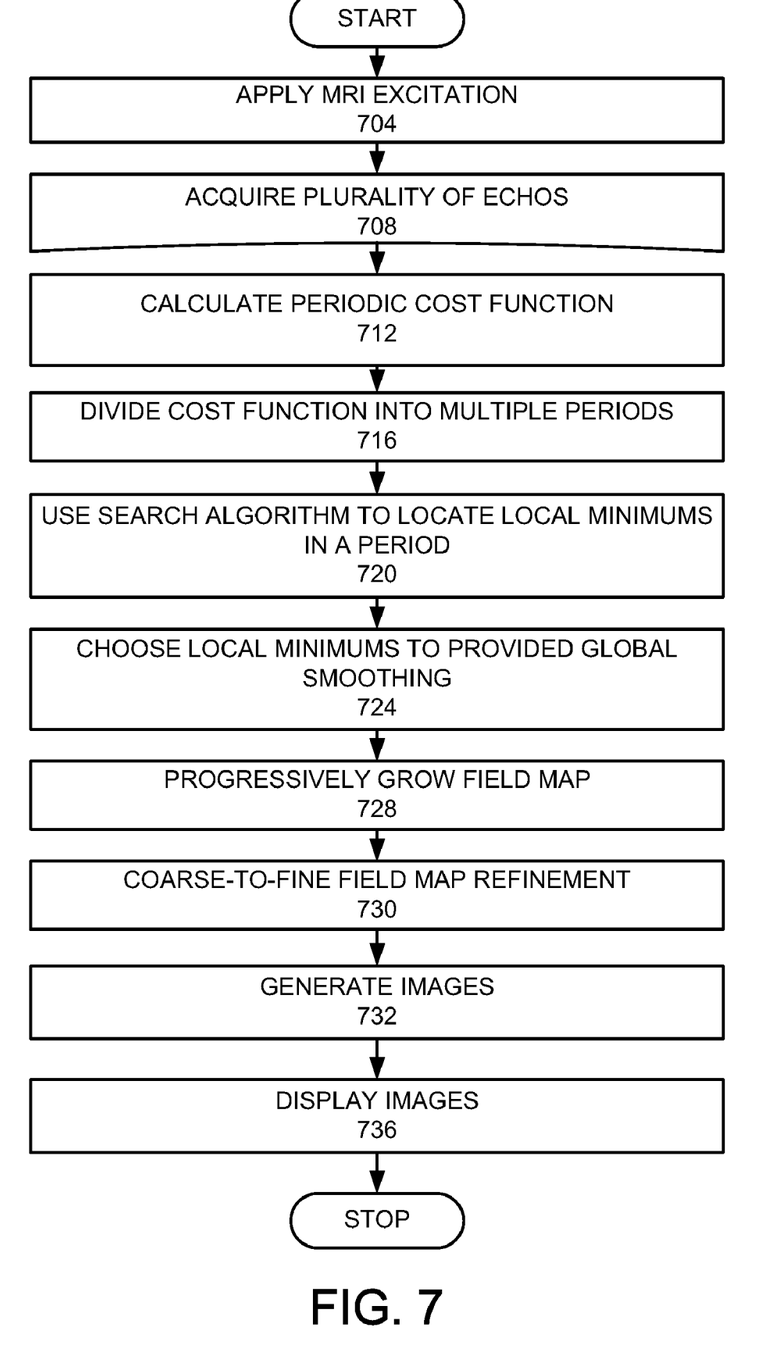
FIG. 7 is a high level flow chart of an embodiment of the invention.

To facilitate understanding, FIG. 7 is a high level flow chart of an embodiment of the invention. At least one MRI excitation is applied (step 704). A plurality of echoes are acquired (step 708). In this example, the echoes are in k-space. A periodic cost function is calculated from the plurality of reconstructed echoes in image domain (step 712). The calculated periodic cost function is divided into multiple periods (step 716). In this example, each period is $1/\Delta TE$. A search algorithm is used to locate local minimums in a period for a pixel (step 720). In this example, the search algorithm is a golden section search algorithm. Local minimums are chosen to provide global smoothing (step 724). A field map is progressively grown from the chosen local minimums (step 728). Preferably, the field map is progressively grown to avoid abrupt change between neighboring field map values. The field map is a map of field inhomogeneities. A coarse-to-fine field map refinement with the multi-resolution pyramidal structure is provided (step 730). Separated water and fat images are generated using the field map (step 732). The images are MRI images that use the field map to determine inhomogeneities. The images are displayed (step 736). The images may be displayed as separated water and fat images or may be combined into a single image.

Figure 8:
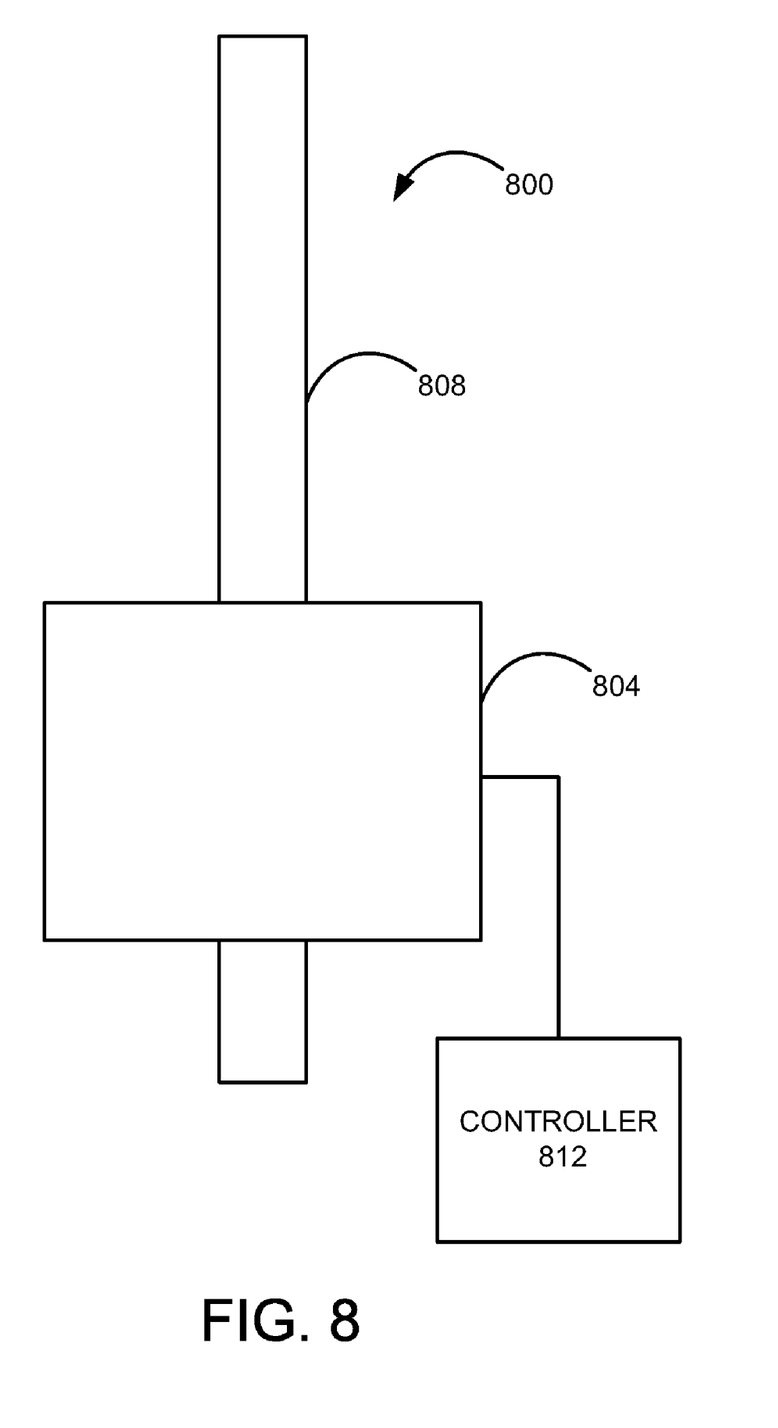
FIG. 8 is a schematic top view of a magnetic resonance imaging (MRI) system that may be used in an embodiment of the invention.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804.

Figure 9A:
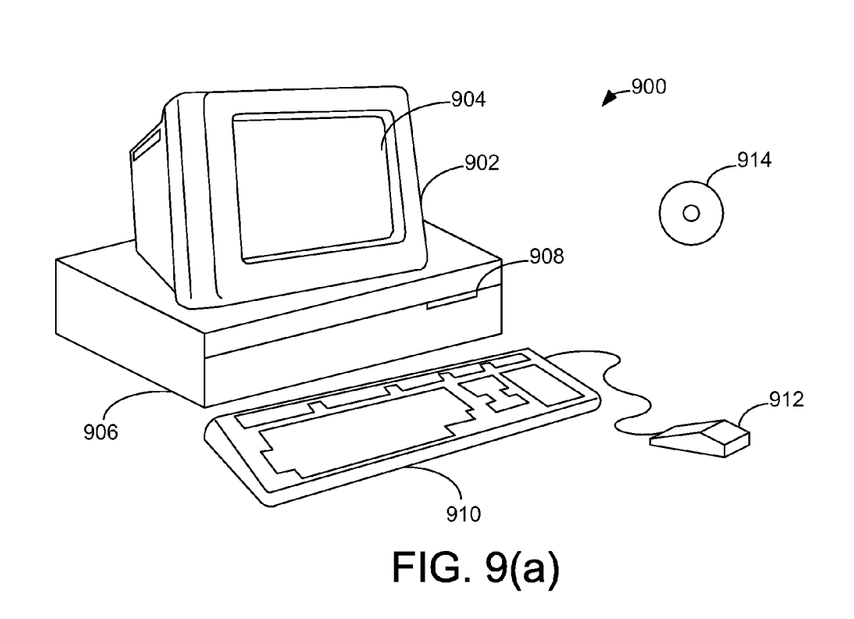
FIGS. 9(a) and 9(b) illustrate a computer system that may be used in an embodiment of the invention.

FIGS. 9(a) and 9(b) illustrate a computer system 900, which is suitable for implementing a controller 812 used in embodiments of the present invention. FIG. 9(a) shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

Figure 9B:
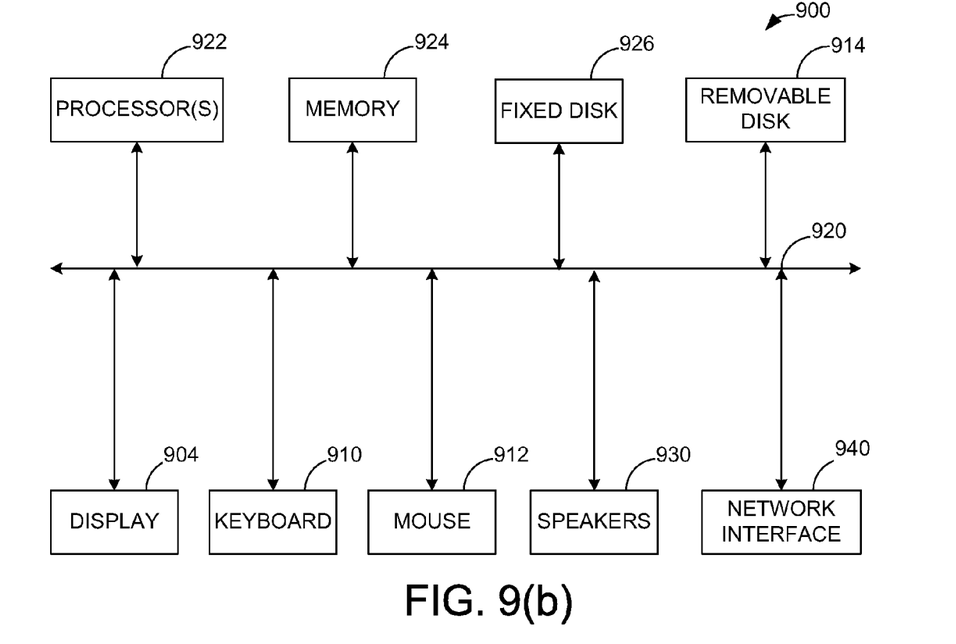

FIG. 9(b) is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of the computer-readable media described below.

CPU 922 is also coupled to a variety of input/output devices, such as display 904, keyboard 910, mouse 912, and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In this example, the controller 812 may be used to generate and then display an image on the display 904.

In a preferred embodiment of the invention, at least one period is centered on 0 Hz. In addition, each period has no more than three local minimums. More preferably the period has less then three local minimums. Therefore, when the period is divided into three overlapping regions, each region will only have one local minimum, which can be quickly found by a golden section search.

Another embodiment maps field inhomogeneity to provide more accurate thermotherapy.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for mapping field inhomogeneity for forming a magnetic resonance image, comprising:
 a) applying a magnetic resonance excitation;
 b) acquiring a plurality of k-space echoes signals;
 c) calculating a periodic cost function from the acquired plurality of k-space echo signals;
 d) dividing a period of the calculated periodic cost function into multiple regions;
 e) using a search algorithm to locate a local minimum in each region of the multiple regions of the divided period;
 f) choosing located local minimums to provide global smoothness; and
 g) generating a field map by progressively growing the field map from the local minimums.

2. The method, as recited in claim 1, wherein the plurality of k-space echo signals is acquired from a single magnetic resonance excitation.

3. The method, as recited in claim 2, wherein the search algorithm is a golden section search algorithm.

4. The method, as recited in claim 3, wherein the number of regions for each period is three.

5. The method, as recited in claim 4, where each period has a period of $1/\Delta TE$.

6. The method, as recited in claim 5, further comprising a center frequency tuned to water.

7. The method, as recited in claim 6, further comprising providing a course-to-fine field map refinement using a multi-resolution pyramidal structure, where a finer field map is generated from a previous level coarser filed map.

8. The method, as recited in claim 1 where at least one period is centered at 0 Hz.

9. The method, as recited in claim 1, further comprising using the field map to generate a magnetic resonance image with species separation.

10. The method, as recited in claim 1, further comprising using the field map to provide thermo therapy.

11. A non-transitory computer implemented method for generating magnetic resonance images, comprising:
 generating an inhomogeneity field map, comprising:
  a) applying a magnetic resonance excitation;
  b) acquiring a plurality of k-space echoes signals;
  c) calculating a periodic cost function from the acquired plurality of k-space echo signals;
  d) dividing a period of the calculated periodic cost function into multiple regions;
  e) using a search algorithm to locate a local minimum in each region of the multiple regions of the divided period;
  f) choosing located local minimums to provide global smoothness;
  g) generating a field map by progressively growing the field map from the local minimums;
  h) using the field map to provide a corrected magnetic resonance image with species separation; and
  i) using the field map to generate a magnetic resonance image.

12. The non-transitory computer implemented method, as recited in claim 11, wherein the plurality of k-space echo signals is acquired from a single magnetic resonance excitation.

13. The non-transitory computer implemented method, as recited in claim 11, wherein the search algorithm is a golden section search algorithm.

14. The non-transitory computer implemented method, as recited in claim 11, wherein the number of regions for each period is three.

15. The non-transitory computer implemented method, as recited in claim 11, where each period has a period of $1/\Delta TE$.

16. The non-transitory computer implemented method, as recited in claim 11, further comprising a center frequency tuned to water.

17. The non-transitory computer implemented method, as recited in claim 11, further comprising providing a course-to-fine field map refinement using a multi-resolution pyramidal structure, where a finer field map is generated from a previous level coarser filed map.

18. A magnetic resonance imaging apparatus, comprising:
 a magnetic resonance imaging excitation and detection system; and
 a controller electrically connected to the magnetic resonance imaging excitation and detection system, comprising:
  a display;
  at least one processor; and
  non-transitory computer readable media, comprising:
   computer readable code for generating an inhomogeneity field map, comprising:
    a) computer readable coded for applying a magnetic resonance excitation;
    b) computer readable code for acquiring a plurality of k-space echoes signals;
    c) computer readable code for calculating a periodic cost function from the acquired plurality of k-space echo signals;
    d) computer readable code for dividing a period of the calculated periodic cost function into multiple regions;
    e) computer readable code for using a search algorithm to locate a local minimum in each region of the multiple regions of the divided period;
    f) computer readable code for choosing located local minimums to provide global smoothness; and
    g) computer readable code for generating a field map by progressively growing the field map from the local minimums;
   computer readable code for using the field map to provide a corrected magnetic resonance image with species separation; and
   computer readable code for displaying the magnetic resonance image on the display.

* * * * *